US009571760B2

(12) United States Patent
Kang et al.

(10) Patent No.: US 9,571,760 B2
(45) Date of Patent: Feb. 14, 2017

(54) ELECTRONIC SENSOR AND METHOD FOR CONTROLLING THE SAME

(71) Applicant: Samsung Electronics Co., Ltd., Suwon-si, Gyeonggi-do (KR)

(72) Inventors: Hwa-Young Kang, Suwon-si (KR); Young-Kwon Yoon, Seoul (KR); Jin-Hong Jeong, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/182,865

(22) Filed: Feb. 18, 2014

(65) Prior Publication Data
US 2014/0347532 A1 Nov. 27, 2014

(30) Foreign Application Priority Data
May 21, 2013 (KR) .................. 10-2013-0057156

(51) Int. Cl.
*G03B 13/00* (2006.01)
*H04N 5/235* (2006.01)
*H04N 5/225* (2006.01)
*H04N 5/351* (2011.01)
*H04N 5/355* (2011.01)
*H04N 9/04* (2006.01)

(52) U.S. Cl.
CPC .......... *H04N 5/351* (2013.01); *H04N 5/35563* (2013.01); *H04N 5/35572* (2013.01); *H04N 9/045* (2013.01)

(58) Field of Classification Search
USPC .................. 348/208.12, 220.1, 221.1, 222.1, 229.1,348/224.1, 227.1, 345, 349, 356, 362–366, 370
See application file for complete search history.

(56) References Cited

U.S. PATENT DOCUMENTS

| | | | |
|---|---|---|---|
| 6,829,008 B1 | 12/2004 | Kondo et al. | |
| 7,924,342 B2 | 4/2011 | Kusaka | |
| 7,956,914 B2 | 6/2011 | Xu | |
| 2003/0011693 A1* | 1/2003 | Oda | 348/272 |
| 2007/0223904 A1* | 9/2007 | Bloom | G03B 13/34 396/100 |
| 2008/0143858 A1 | 6/2008 | Kusaka | |
| 2010/0066878 A1 | 3/2010 | Mabuchi | |
| 2011/0013061 A1 | 1/2011 | Hoda et al. | |
| 2011/0037888 A1 | 2/2011 | Onuki | |
| 2012/0281111 A1 | 11/2012 | Jo et al. | |
| 2013/0057740 A1* | 3/2013 | Takaiwa | H04N 5/2354 348/297 |
| 2014/0063300 A1* | 3/2014 | Lin | H04N 9/045 348/277 |

(Continued)

FOREIGN PATENT DOCUMENTS

| | | |
|---|---|---|
| JP | 2959142 B2 | 7/1999 |
| JP | 3592147 B2 | 9/2004 |

(Continued)

*Primary Examiner* — Aung S Moe
*Assistant Examiner* — Euel Cowan
(74) *Attorney, Agent, or Firm* — Jefferson IP Law, LLP

(57) ABSTRACT

An electronic sensor and a method for controlling the electronic sensor are provided. The electronic sensor includes at least two pixels having different light-receiving efficiencies and at least two pixel groups having different exposure settings. At least one of the at least two pixels corresponds to at least one of the at least two pixel groups.

21 Claims, 10 Drawing Sheets

(56) References Cited

U.S. PATENT DOCUMENTS

2014/0176780 A1    6/2014  Koshiba
2014/0267850 A1*  9/2014  Li ..................... H04N 5/23212
                                                  348/294

FOREIGN PATENT DOCUMENTS

| | | |
|---|---|---|
| JP | 2008-61844 A | 3/2008 |
| JP | 2008-152012 A | 7/2008 |
| JP | 2009-194604 A | 8/2009 |
| KR | 10-0761376 B1 | 6/2007 |
| KR | 10-2009-0098002 A | 9/2009 |
| KR | 10-2011-0062981 A | 6/2011 |
| WO | 2010066381 A1 | 6/2010 |
| WO | 2013/042518 A1 | 3/2013 |

* cited by examiner

ELECTRONIC SENSOR AND METHOD FOR CONTROLLING THE SAME

CROSS-REFERENCE TO RELATED APPLICATION

This application claims the benefit of priority under 35 U.S.C. §119(a) of a patent application filed on May 21, 2013 at the Korean Intellectual Property Office and assigned serial no. 10-2013-0057156, the entire disclosure of which is hereby incorporated by reference.

TECHNICAL FIELD

The present disclosure relates to an electronic sensor such as a digital image sensor, for example, an image sensor having a wide dynamic range (WDR) function.

BACKGROUND

In a photographing device such as, for example, a mirrorless camera or a mobile communication terminal, a contrast focus detection scheme may be used. Also, a wide dynamic range (WDR) function, in which a higher-exposure image and a lower-exposure image of the same object are combined, may be provided.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, various aspects of the present disclosure provide a digital image sensor into which a Wide Dynamic Range (WDR) function and various other functions are integrated, and a method for controlling the digital image sensor. For example, a phase-difference focus adjustment (or focusing) function and a WDR function both may be mounted on a single image sensor. In addition, a miniaturized image capturing device which may capture a high-quality image may be implemented. Furthermore, a digital image sensor which may simultaneously support a WDR function and other functions may be implemented.

Other objects to be provided in the present disclosure may be understood by various embodiments described below.

An electronic sensor comprises a first pixel, a second pixel having a lower exposure efficiency than the first pixel, a first pixel group configured to acquire an exposure amount and a second pixel group configured to acquire a less exposure amount than the exposure amount, wherein the first pixel group includes at least one of the second pixel and the second pixel of the first pixel group detects a subject image for acquiring focusing state information.

A method comprises: associating at least a first pixel of an electronic sensor with a first pixel group, the first pixel group configured to detect at least a first portion of a subject image for a first exposure duration; associating at least a second pixel of the electronic sensor with a second pixel group, the second pixel group configured to detect at least a second portion of the subject image for a second exposure duration, the second exposure duration being shorter than the first exposure duration; and acquiring focusing state information via the at least a first pixel.

A non-transitory machine-readable storage medium stores instructions that, when executed by one or more processors, cause the one or more processors to perform operations including associating at least a pixel of an electronic sensor with a pixel group configured to receive light for a specified period of time. The operations also include associating at least another pixel of the electronic sensor with another pixel group configured to receive light for another specified period of time. The pixel and the another pixel have different light efficiencies.

Other embodiments, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other embodiments, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
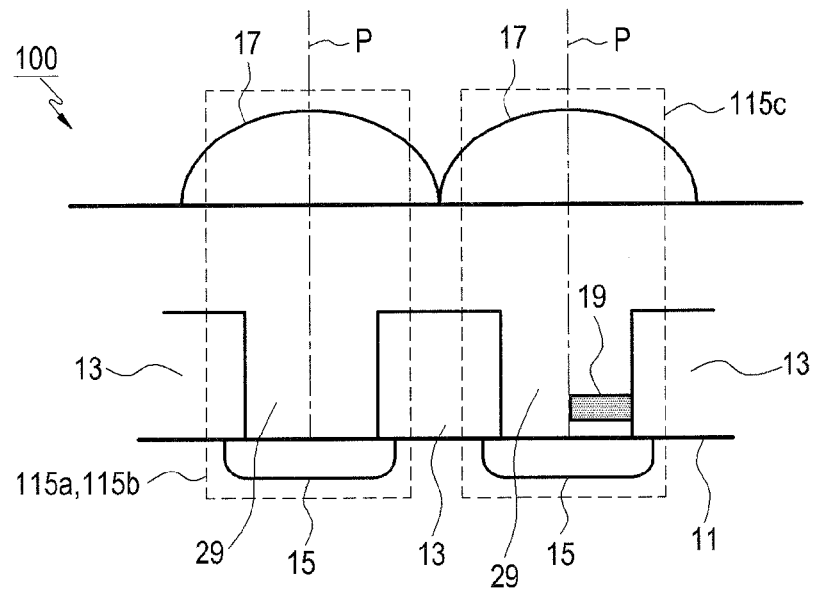
FIG. 1 is an enlarged view illustrating a portion of a digital image sensor according to various embodiments of the present disclosure.

Hereinafter, various embodiments of the present disclosure will be described in detail with reference to the accompanying drawings. It includes various specific details to assist in that understanding but these are to be regarded as merely examples. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

An electronic sensor, for example, a digital image sensor according to various embodiments of the present disclosure, discloses arrangement of pixels which stably implement a focus detection function while providing a Wide Dynamic Range (WDR) function. Pixels of an image sensor according to various embodiments of the present disclosure may include pixels ('lower-efficiency pixels') that structurally or functionally have a lower light-receiving efficiency than other pixels of the image sensor. The lower-efficiency pixels may include pixels having phase separation structures, pixels having filters of colors such as red, green, and blue, and pixels having micro lens structures that pass less light than other pixels.

An electronic sensor, for example, an image sensor according to various embodiments of the present disclosure, includes pixels for detecting image information, at least some of which are lower-efficiency pixels, and detects information regarding a focus adjustment (or focusing) state by using the lower-efficiency pixels. According to a certain embodiment of the present disclosure, the lower-efficiency pixels may use a longer exposure time (or duration) than other pixels of the image sensor to acquire the same amount of image information. For example, between a pair of lower-efficiency pixels having phase separation structures, a first lower-efficiency pixel may detect light that passes through a side of an exit pupil of an imaging lens, for example, image information, and a second lower-efficiency pixel may detect light that passes through another side of the exit pupil of the imaging lens, for example, image information. A controller of an electronic device according to various embodiments of the present disclosure may detect the focusing state by comparing distances between an image detected by the first lower-efficiency pixel and an image detected by the second lower-efficiency pixel.

Moreover, pixels of an electronic sensor, for example, an image sensor according to various embodiments of the present disclosure, may be classified into at least two groups, such that a first pixel group is set to have a higher or lower pixel exposure amount than a second pixel group, thus implementing a WDR function. The pixel exposure amount may be set by an exposure duration, a pixel's photoelectric conversion efficiency (or film speed), a pixel's size, a lens adjustment, or a color filter. According to various embodiments of the present disclosure, pixels having a higher exposure amount ('higher-exposure pixels') may detect image information of a dark part of a region of an image formed in the image sensor, and pixels having a lower exposure amount ('lower-exposure pixels') may detect image information of a bright part of a region of a capturing image.

As mentioned previously, lower-efficiency pixels have a lower light-receiving efficiency than other pixels ('image detection pixels'). Assuming a same exposure duration, the lower-efficiency pixels may have less light incident thereto per unit time than the image detection pixels structurally or under control of the controller. For example, assuming the same exposure duration, the lower-efficiency pixels may acquire less image information than the image detection pixels.

When setting a pixel group for implementing a WDR function, an electronic sensor, for example, a digital image sensor according to various embodiments of the present disclosure, may arrange lower-efficiency pixels to correspond to a higher-exposure pixel group, thus improving performance of pixels having a relatively insufficient amount of received light (for example, lower-efficiency pixels). As such, by acquiring the information regarding the focusing state based on the lower-efficiency pixels arranged to correspond to the higher-exposure pixel group, more accurate focus detection is possible. The information regarding the focusing state may also be acquired from lower-exposure pixels arranged to correspond to a lower-exposure pixel group, but focus detection performance may be lower than the lower-efficiency pixels arranged to correspond to the higher-exposure pixel group.

When pixels are configured to form an image sensor, if a filter having an insufficient amount of received light is disposed, pixels in which a particular color filter is disposed may be set as higher-exposure pixels. In this case, lower-efficiency pixels may be arranged to correspond to those color filters. According to a mode setting or a photographing time of an electronic device including an image sensor according to various embodiments of the present disclosure, pixels of the image sensor may be re-arranged in positions of higher-exposure pixels and lower-exposure pixels. In this way, when the pixels of the image sensor are dynamically assigned, at least some of the lower-efficiency pixels may be positioned in a higher-exposure group. When the pixels of the image sensor are re-arranged in a first pixel group and a second pixel group, photoelectric conversion efficiency of each pixel of the image sensor may be changed or an exposure duration of each pixel may be adjusted, by the controller of the image sensor. The lower-efficiency pixels distributed on the image sensor are also classified into one of a group of pixels set as the higher-exposure pixels and a group of pixels set as the lower-exposure pixels, and the controller may detect information regarding a better focusing state based on information detected from the lower-efficiency pixels classified into the higher-exposure pixel group.

Hence, during a maximum exposure duration allowed by a digital image sensor according to various embodiments of the present disclosure, at least some lower-efficiency pixels may acquire image information necessary for focus detection. Respective lower-efficiency pixels are set to a same environment, for example, a same exposure amount, for image detection, thus maintaining consistency among the lower-efficiency pixels that acquire information necessary for focus detection.

Hereinafter, a further detailed description of the digital image sensor will be provided with reference to FIGS. 1, 2, 3, 4, 5, 6A, 6B, 7, 8, 9, 10, 11, 12, 13, 14, and 15.

FIG. 1 is an enlarged view of a part of a digital image sensor 100 according to one embodiment of the present disclosure.

Referring to FIG. 1, each of unit pixels 115a, 115b, and 115c of the digital image sensor 100 includes an interconnection region 13, a light-receiving region 15, and an imaging lens, for example, a micro lens 17.

The interconnection regions 13 may be arranged with a predetermined interval on a surface of a substrate 11 of the image sensor 100, and the light-receiving region 15 may be arranged between the interconnection regions 13. For example, the interconnection regions 13 and the light-receiving regions 15 may be arranged alternately on the surface of the substrate 11. On the interconnection regions 13, elements such as a power or signal line and a transistor may be disposed. The light-receiving regions 15 may be photoelectric conversion regions that detect, substantially, light and an image for conversion into an electric signal, and deliver the electric signal corresponding to information of the detected image to the interconnection regions 13.

Each of the unit pixels 115a, 115b, and 115c may include one light-receiving region 15, interconnections and transistors of the interconnection regions 13 connected to the light-receiving region 15, and the micro lens 17 arranged to correspond to the light-receiving region 15. Multiple pixels of the unit pixels 115a, 115b, and 115c may operate as image detection pixels 115a and 115b, and some pixels may include lower-efficiency pixels having lower light reception efficiency than the image detection pixels 115a and 115b, as mentioned above. The lower-efficiency pixels may be configured as focus detection pixels, for example, phase-difference focus detection pixels 115c having a phase separation structure. According to an embodiment of the present disclosure, lower-efficiency pixels may do not have a phase separation structure. For example, by using a color filter or a micro lens passing less light therethrough, the exposure amount of some pixels may be limited to be smaller than the other pixels.

Figure 8:
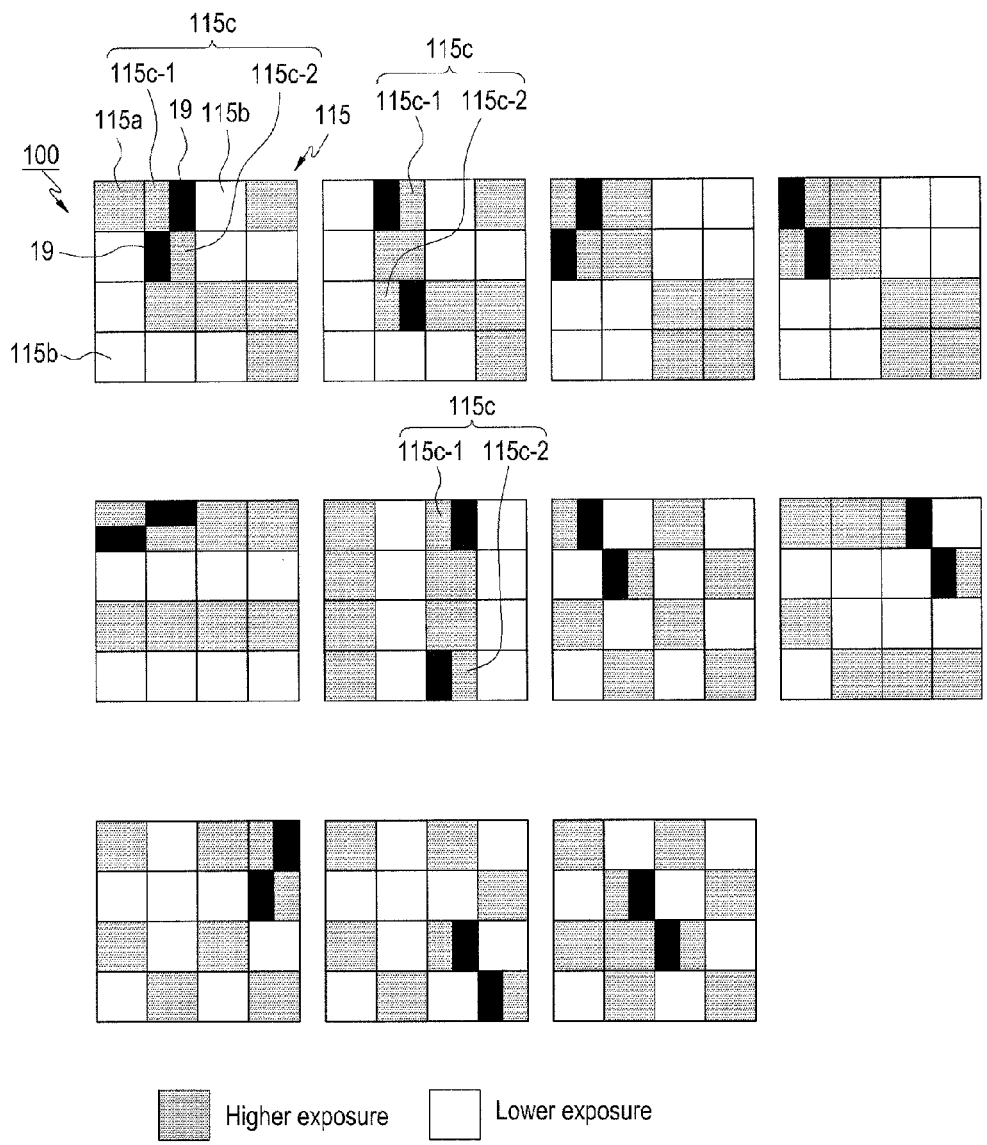
FIG. 8 illustrates various arrangements of pixels including phase-difference focus detection pixels in a digital image sensor according to various embodiments of the present disclosure.

FIG. 1 illustrates a phase separation structure in which a light-shielding layer 19 is installed in the light-receiving region 15 when the phase-difference focus detection pixels 115c are configured. Each micro lens 17 may be disposed such that its optical axis P coincides with the light-receiving region 15 corresponding to the micro lens 17. In FIG. 1, between the interconnection regions 13 above the light-receiving region 15, a cavity 29 is formed and the light-shielding layer 19 may be disposed in the cavity 29 between the interconnection regions 13. Referring also to FIG. 8, the light-shielding layer 19 may cover a part of the surface area of the light-receiving region 15, for example, about half of the surface area of the light-receiving region 15 in a side of the light-receiving region 15, thus partially shielding light incident into the light-receiving region 15. Assuming the same exposure duration, the phase-difference focus detection pixels 115c may have an exposure amount that is about a half of that of the image detection pixels 115a and 115b.

According to an embodiment of the present disclosure, for example, as illustrated in FIG. 8, the phase-difference focus detection pixels 115c may include a pair of pixels 115c-1 and 115c-2 that are arranged adjacent to each other or spaced apart from each other. The light-shielding layer 19 disposed in the first phase-difference focus detection pixel 115c-1 may be disposed not to overlap with the light-shielding layer 19 disposed on the second phase-difference focus detection pixel 115c-2, for example, in an offset position. In this case, when the first phase-difference focus detection pixel 115c-1 detects light passing through a side of the exit pupil of the micro lens 17, the second phase-difference focus detection pixel 115c-2 may detect light passing through the other side of the exit pupil of the micro lens 17. The image sensor 100 and/or an electronic device such as a camera or a portable terminal in which the image sensor 100 is mounted compares distances between images detected from the phase-difference focus detection pixels 115c, thus measuring the focusing state of the image sensor 100.

Figure 2:
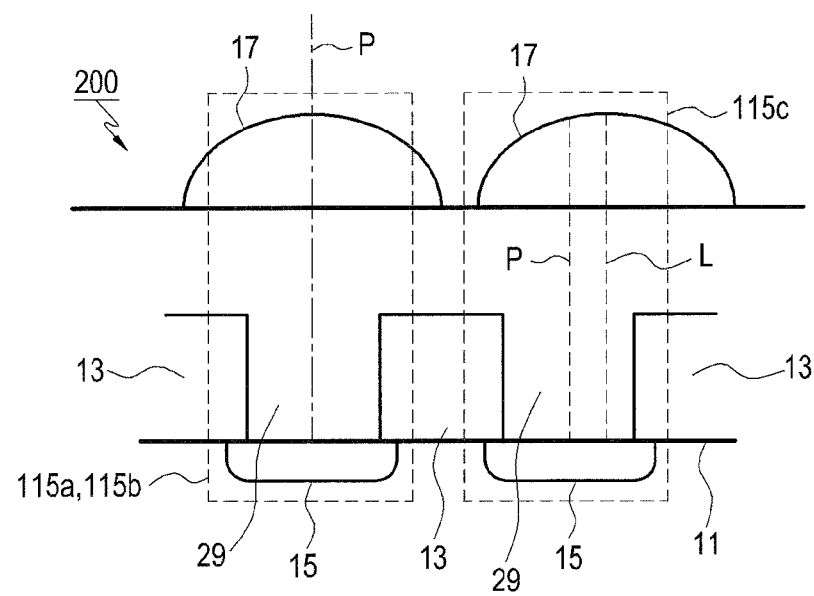
FIG. 2 is an enlarged view illustrating a portion of a digital image sensor according to various embodiments of the present disclosure.

FIG. 2 is an enlarged view of a part of a modified digital image sensor 200 according to various embodiments of the present disclosure. When the image sensor 200 illustrated in FIG. 2 is described, components having structures or functions that are similar to those of the image sensor 100 illustrated in FIG. 1 may be indicated by the same reference numerals in spite of differences in the structures.

Referring to FIG. 2, the phase-difference focus detection pixels 115c are illustrated which are disposed such that an optical axis L of the micro lens 17 deviates from the optical axis P of the light-receiving region 15. In the phase-difference focus detection pixels 115c illustrated in FIG. 2, as the optical axis L of the micro lens 17 deviates from the optical axis P of the light-receiving region 15, only light passing through either one side or the other side of the exit pupil of the micro lens 17 may be incident to the light-receiving region 15. The phase-difference focus detection pixels 115c form a corresponding pair and are used for a focus detection operation, and the micro lenses 17 of the phase-difference focus detection pixels 115c in pairs may be disposed in an offset position with respect to each other.

As such, lower-efficiency pixels of the image sensor according to various embodiments of the present disclosure may have a phase separation structure in which the light-shielding layer 19 is disposed or the optical axis P of the micro lens 17 deviates from the optical axis P of the light-receiving region 15. However, as stated previously, the image sensor according to various embodiments of the present disclosure may implement lower-efficiency pixels by using a filter or a micro lens disposed to correspond to some pixels.

The phase-difference focus detection pixels 115c will be further described below in which the light-shielding layer 19 according to various embodiments of the present disclosure is installed.

Figure 3:
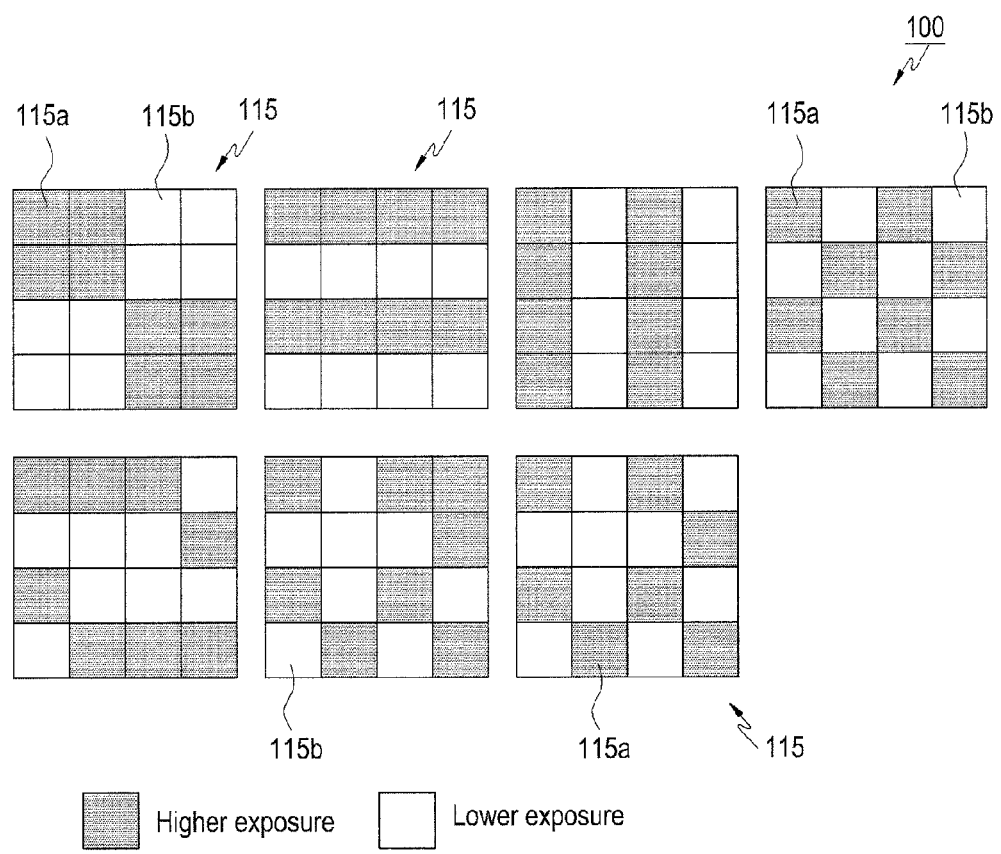
FIG. 3 illustrates various arrangements of image detection pixels in a digital image sensor according to various embodiments of the present disclosure.

FIG. 3 illustrates various example arrangements of the image detection pixels 115a and 115b in the digital image sensor 100 according to various embodiments of the present disclosure. For example, as stated above, the WDR function may be implemented by disposing the pixels 115 of the image sensor 100 separately as at least two pixel groups having different exposure amount settings. To this end, the pixels 115 may be fixed during a production process of the image sensor 100 or may be disposed adaptively according to a photographing mode of a device in which the image sensor 100 is mounted. In the descriptions of various embodiments of the present disclosure, the term "different exposure amount settings" may mean that a length of a duration during which the higher-exposure pixels 115a are exposed and a length of a duration during which the lower-exposure pixels 115b are exposed are different from each other. For different exposure amount settings, in some embodiments, exposure of the lower-exposure pixels 115b may be performed simultaneously with exposure of the higher-exposure pixels 115a. On the other hand, exposure of the higher-exposure pixels 115a may not be necessarily performed simultaneously with exposure of the lower-exposure pixels 115b. For different exposure amount settings, in some embodiments, the photoelectric conversion efficiencies of the higher-exposure pixels 115a and the lower-exposure pixels 115b may be set to be different from each other. For different exposure amount settings, in some embodiments, pixel sizes of the higher-exposure pixels 115a and the lower-exposure pixels 115b may be set to be different from each other, or the amount of light incident to pixels per unit time may alternatively be adjusted by controlling a lens or a filter.

FIGS. 4, 5, 6A, 6B, and 7 illustrate graphs related to exposure of the pixels 115 of the digital image sensor 100 according to various embodiments of the present disclosure.

Figure 4:
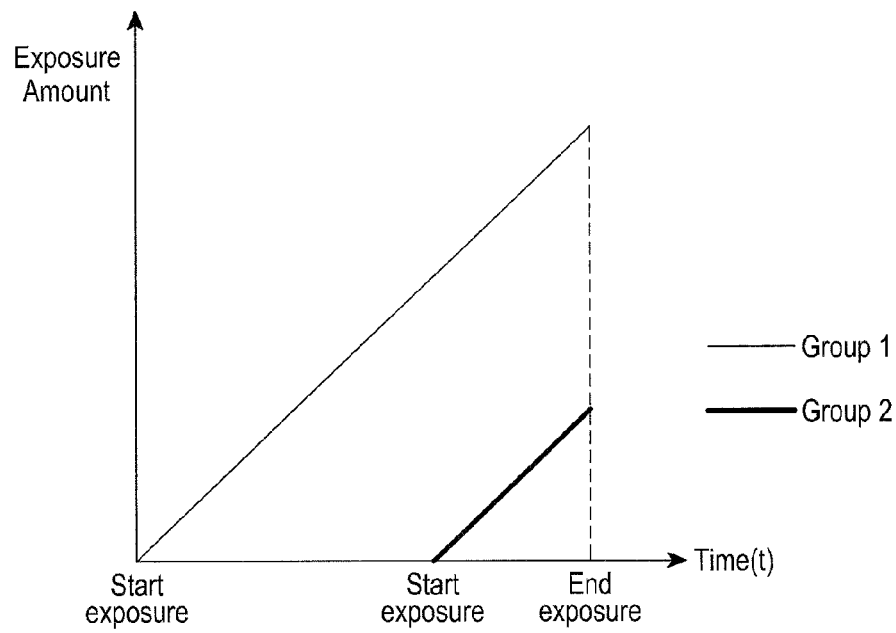
FIGS. 4, 5, 6A, 6B, and 7 are graphs associated with an exposure operation of pixels of a digital image sensor according to various embodiments of the present disclosure.

Referring to FIG. 4, a group of second pixels having a relatively low light-receiving efficiency, for example, a group of the lower-exposure pixels 115b, Group 2, may start exposure later than a group including first pixels, for example, a group of the higher-exposure pixels 115a, Group 1, and exposure of the pixels of the first pixel group, i.e., Group 1, and exposure of the pixels of the second pixel group, i.e., Group 2, may end at the same time.

Figure 5:
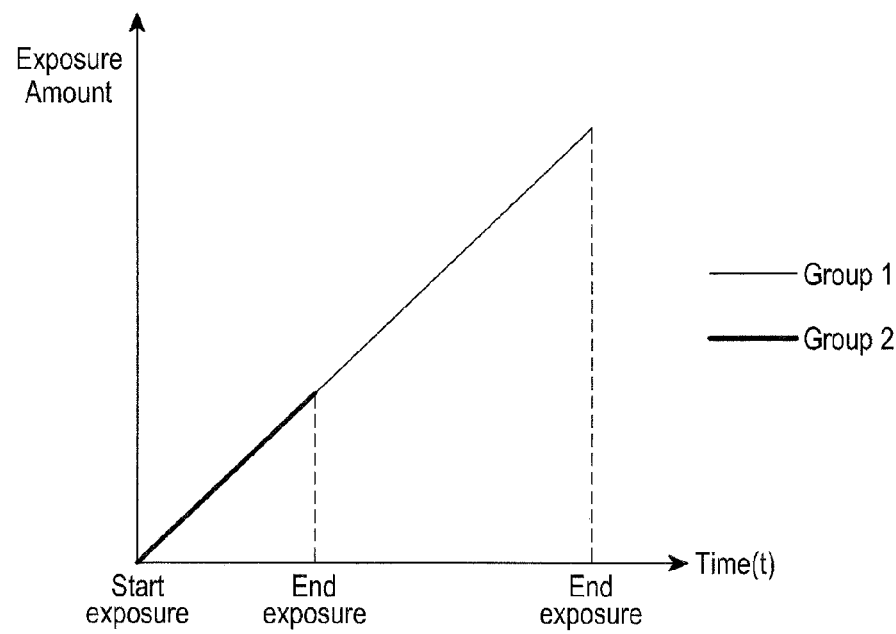

FIG. 5 illustrates a structure in which exposure of the pixels of Group 1 and exposure of the pixels of Group 2 start at the same time, and exposure of the pixels of Group 2 ends earlier than exposure of the pixels of Group 1 in the image sensor 100 according to various embodiments of the present disclosure. Although not illustrated in FIG. 5, exposure of the pixels of Group 2 may start later and end earlier than exposure of the pixels of Group 1.

Figure 6A:
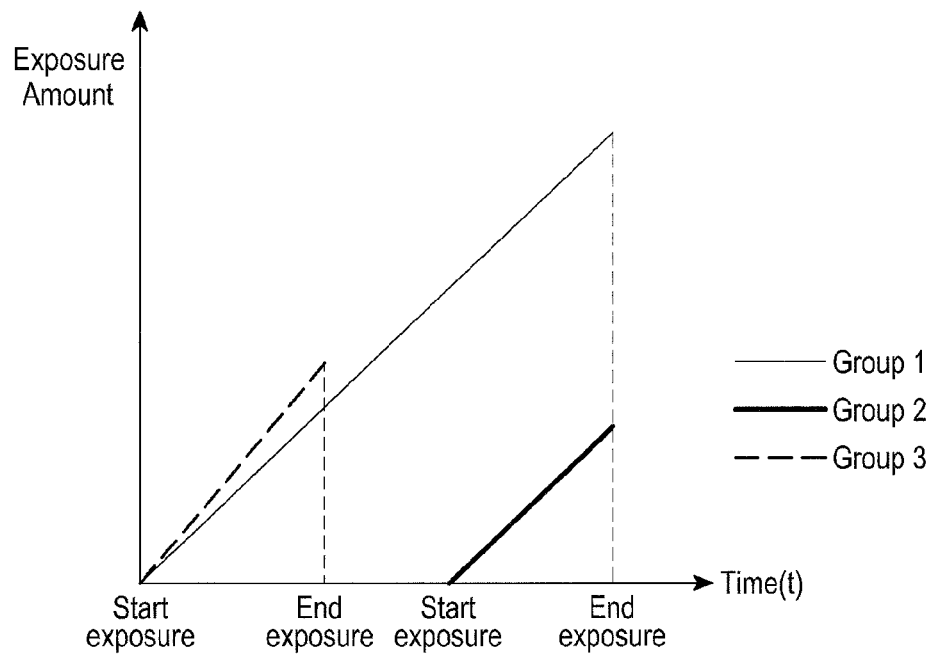

FIG. 6A illustrates a structure in which the pixels 15 of the image sensor 100 according to various embodiments of the present disclosure are classified into the first pixel group Group 1 and the second pixel group Group 2, and exposure of the pixels of Group 2 having a relatively small exposure amount is performed twice to acquire middle-exposure image information.

Referring to FIG. 6A, during exposure of the pixels of Group 1, the pixels of Group 2 may be sequentially exposed twice. Thus, although the pixels 115 of the image sensor 100 are classified into two groups having different exposure durations, the same effect as when the pixels 115 of the image sensor 100 are classified into three pixels groups, i.e., Group 1, Group 2, and Group 3, having different exposure durations may be obtained. In this case, primary exposure of Group 2, for example, a group of the lower-exposure pixels 115b, starts simultaneously with exposure of the group of the higher-exposure pixels 115a, and during exposure of the group of the higher-exposure pixels 115a, secondary exposure of Group 2, for example, the group of the lower-exposure pixels 115b may be performed after end of the primary exposure and may end simultaneously with end of exposure of the group of the higher-exposure pixels 115a.

According to some embodiments of the present disclosure, a length of a duration of the primary exposure of the pixels of Group 2, for example, the lower-exposure pixels 115b may be set different from a length of a duration of the secondary exposure of the lower-exposure pixels 115b. According to some embodiments of the present disclosure, the lower-exposure pixels 115b may be set to undergo an exposure operation two or more times, for example, three times or four times. By doing so, in implementation of the WDR function, the pixels 15 of the image sensor 100 may be set as three or more groups having different exposure durations.

According to an embodiment of the present disclosure, some of the pixels 115 of the image sensor 100 may be set as the first pixel group Group 1 for detecting an object image during a preset exposure duration, and other of the pixels 115 of the image sensor 100 may be set as the second pixel group Group 2 for detecting the object image during an exposure duration that is set shorter than that of Group 1. Others of the pixels 115 that are not set as either the first pixel group Group 1 or the second pixel group Group 2 may be set as a third pixel group Group 3 for detecting the object image during a shorter duration than the pixels of Group 1 and longer than the pixels of Group 2. The pixels of Group 1 may be the higher-exposure pixels 115a, the pixels of Group 3 may be middle-exposure pixels, and the pixels of Group 2 may be the lower-exposure pixels 115b.

According to another embodiment of the present disclosure, the pixels 115 of the image sensor 100 may be set as the first pixel group Group 1, the second pixel group Group 2, and the third pixel group Group 3, in which exposure durations of the respective pixel groups may be the same as one another, but one of the pixel groups may have a different photoelectric conversion efficiency or exposure amounts of the pixels of the respective pixel groups may be set to be different using a pixel size, adjustment of a lens or a filter, or an additional light-shielding layer.

Figure 6B:
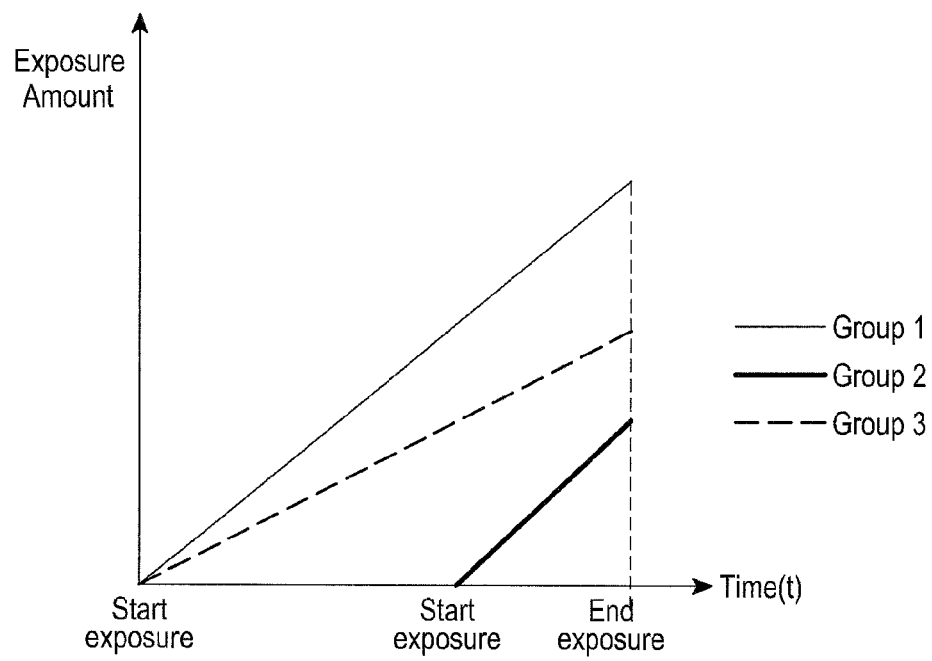

FIG. 6B is a graph associated with exposure of the pixels 115 of the image sensor 100 according to one of the various embodiments of the present disclosure, in which the third pixel group Group 3 has the same exposure duration as the first pixel group Group 1, but has a lower exposure amount than Group 1. As such, by changing a gradient of change of an exposure amount over time with the same exposure duration, the pixels 115 of the image sensor 100 may be set as the first pixel group Group 1, the second pixel group Group 2, and the third pixel group Group 3. Setting of different exposure amounts over time may be adjusted by controlling photoelectric conversion efficiencies of the respective pixels 115.

Figure 7:
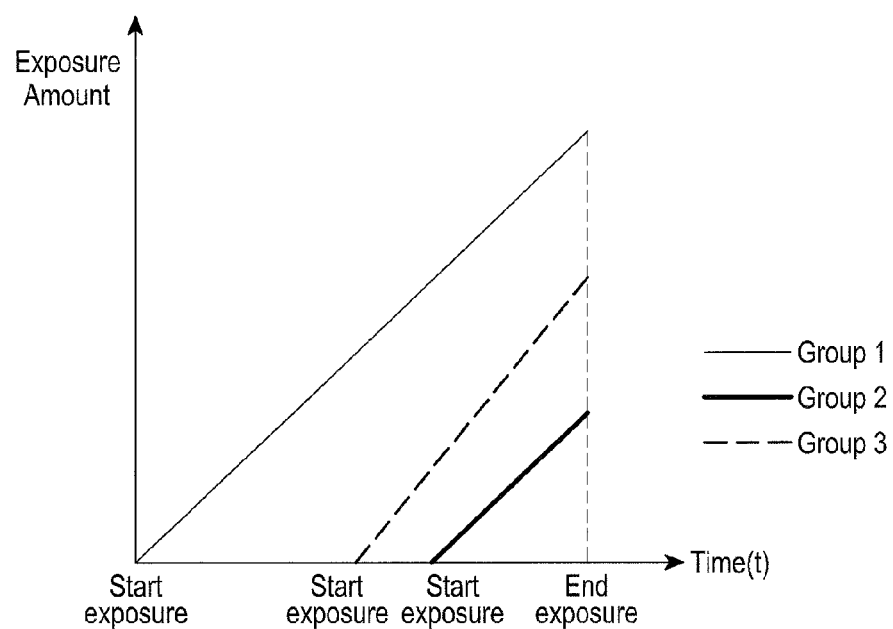

FIG. 7 is a graph associated with exposure when the pixels 115 of the image sensor 100 according to various embodiments of the present disclosure are classified into three groups having different exposure durations. For example, as illustrated in FIG. 7, exposure of the first pixel group Group 1, exposure of the second pixel group Group 2, and exposure of the third pixel group Group 3 may be performed independently of one another.

In this way, according to various embodiments of the present disclosure, pixels may be set as different groups by setting a gradient of change of an exposure amount differently according to exposure durations. For example, the amount of light incident to a pixel per unit time may be adjusted by controlling a photoelectric conversion efficiency of a pixel, a pixel size, or a lens or a filter, or by using an additional light-shielding layer, thereby differently setting exposure amounts of pixels of different pixel groups according to an exposure duration.

According to various embodiments of the present disclosure, an exposure amount may be adjusted in a bright environment by using an exposure duration difference. According to various embodiments, an exposure amount may be adjusted in a dark environment by using the same exposure duration and a variation in gradient of change of an exposure amount, for example, photoelectric conversion efficiency.

By performing exposure separately for the higher-exposure pixels 115a and the lower-exposure pixels 115b, and optionally, the middle-exposure pixels, of the pixels 115 of the image sensor 100, the image sensor 100 may detect multiple image information formed during an exposure duration of the respective pixels for a given object. According to an embodiment, ratios of high exposure, middle exposure, and low exposure may be determined according to a desired dynamic range. According to the exposure ratio, an exposure duration of the higher-exposure pixels 115a and an exposure duration of the lower-exposure pixels 115b may be determined. For example, when an exposure ratio is determined according to an exposure duration, if an exposure duration for proper exposure is 1/250 and an exposure ratio is 1:2:4, then the higher-exposure pixels 115a may have an exposure duration of 1/125, the lower-exposure pixels 115b may have an exposure duration of 1/500, and the middle-exposure pixels may have an exposure duration of 1/250. The multiple image information detected from the respective pixels may be combined by the controller of the electronic device to complete a captured image.

FIG. 8 illustrates various arrangements of the pixels 115 including the phase-difference focus detection pixels 115c in a digital image sensor, for example, the image sensor 100, according to various embodiments of the present disclosure.

Referring to FIG. 8, the phase-difference focus detection pixels 115c may be disposed to correspond to the pixels set as the higher-exposure pixels 115a. Arrangement of the phase-difference focus detection pixels 115c to correspond to the pixels set as the higher-exposure pixels 115a will be further described below.

The higher-exposure pixels 115a at a particular point in time are not necessarily maintained as the higher-exposure pixels at all times. For example, a dark region and a bright region may vary according to a photographing point in time, or an object or arrangement of the higher-exposure pixels 115a and the lower-exposure pixels 115b may be reset according to a user's manipulation.

According to an embodiment of the present disclosure, the phase-difference focus detection pixels 115c may be formed in which the light-shielding layer 19 is disposed or the optical axis L of the micro lens 17 deviates from the optical axis P of the light-receiving region 15. The positions of the phase-difference focus detection pixels 115c may not be reset in the photographing point in time and may be fixed in particular positions according to structural characteristics. Moreover, according to various embodiments of the present disclosure, the digital image sensor (for example, the image sensor 100) may reset arrangement of higher-exposure pixels (for example, the higher-exposure pixels 115a), the lower-exposure pixels (for example, the lower-exposure pixels 115b), and optionally, the middle-exposure pixels (for example, pixels having an exposure duration between the exposure duration of the higher-exposure pixels and the exposure duration of the lower-exposure pixels).

Additionally or selectively, the image sensor (for example, the image sensor 100) according to various embodiments of the present disclosure may set at least some phase-difference focus detection pixels (for example, the phase-difference focus detection pixels 115c) to be arranged to correspond to higher-exposure pixels. According to an embodiment of the present disclosure, as illustrated in FIG. 8, when the pixels 115 of the image sensor 100 are set as the higher-exposure pixels 115a and the lower-exposure pixels 115b, the number of higher-exposure pixels 115a and the number of lower-exposure pixels 115b may be set to be either equal to or different from each other, and the higher-exposure pixels 115a and the lower-exposure pixels 115b may be regularly arranged by repetition of a particular pattern or may alternatively be irregularly arranged. When the pixels 115 of the image sensor 100 are rearranged as the higher-exposure pixels 115a and the lower-exposure pixels 115b and, optionally, the middle-exposure pixels, some of the phase-difference focus detection pixels 115c may be arranged to correspond to the higher-exposure pixels 115a.

Figure 9:
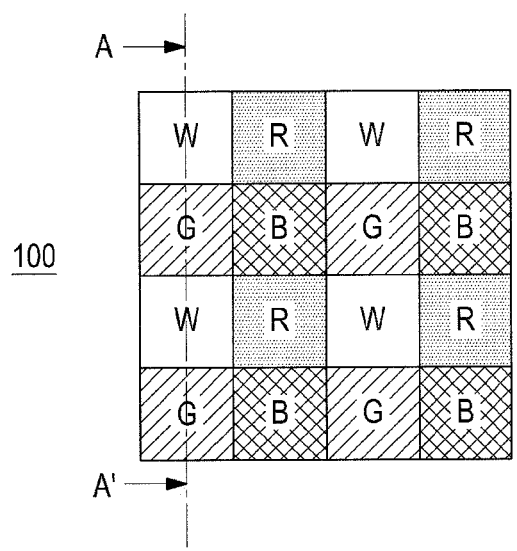
FIG. 9 illustrates arrangements of color filters in a digital image sensor according to various embodiments of the present disclosure.
Figure 10:
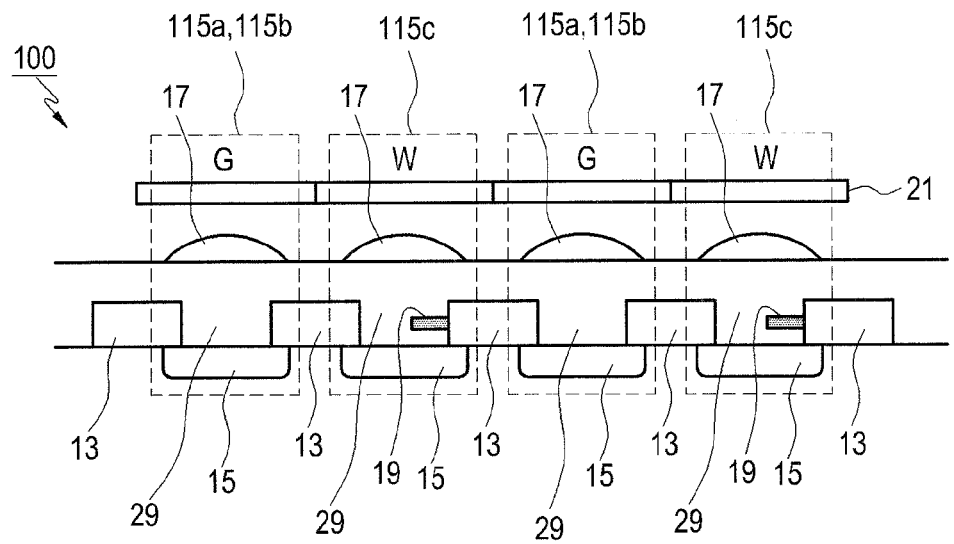
FIG. 10 is a cross-sectional view cut along a line A-A' of the digital image sensor illustrated in FIG. 9 according to various embodiments of the present disclosure.
Figure 11:
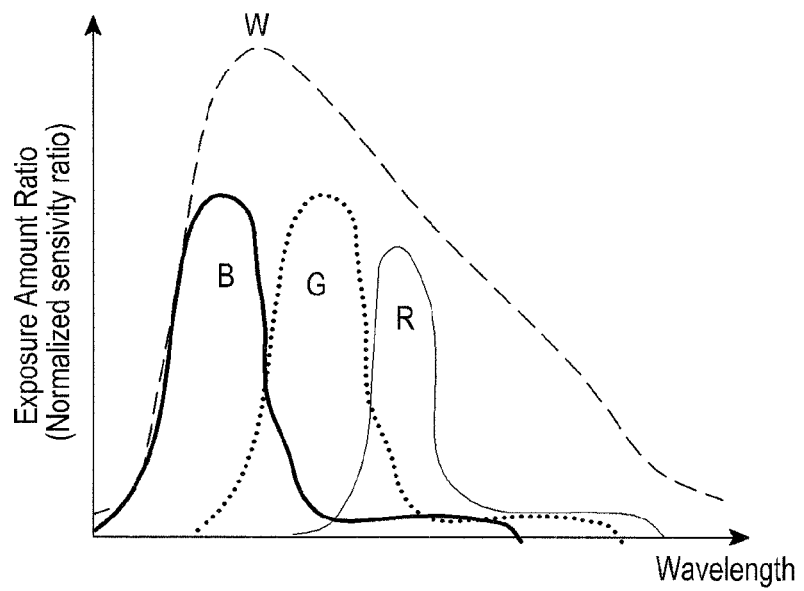
FIG. 11 is a graph illustrating characteristics of color filters according to various embodiments of the present disclosure.

FIG. 9 illustrates arrangement of color filters in a digital image sensor according to various embodiments of the present disclosure, and FIG. 10 is a cross-sectional view cut along a line A-A' of the digital image sensor illustrated in FIG. 9 according to various embodiments of the present disclosure.

Referring to FIGS. 9 and 10, the image sensor 100 according to various embodiments of the present disclosure includes color filters 21 corresponding to the pixels 115a, 115b, and 115c. For example, the various color filters 21 may include a white-light filter W, a red-light filter R, a green-light filter G, or a blue-light filter B, or a filter that transmits or shields light of another color. The color filters 21 may have different transmissivities according to a wavelength of incident light. For example, referring to FIG. 11, the white-light filter W may have a higher exposure rate amount than the red-light filter R, the green-light filter G, and the blue-light filter B, and exposure amount rates of the red-light filter R, the green-light filter G, and the blue-light filter B may be similar to one another. Thus, pixels disposed to correspond to the white-light filter W during the same exposure duration may have a higher exposure amount than other pixels. To compensate for an insufficient amount of received light of the phase-difference detection pixels 115c, the phase-difference detection pixels 115c may be disposed to have the white-color filter W.

Figure 12:
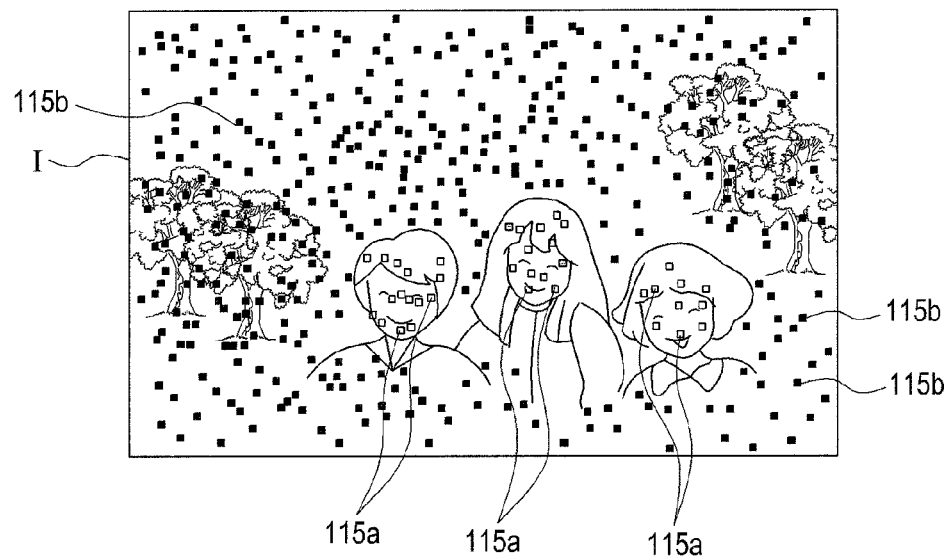
FIGS. 12 and 13 illustrate captured screens of a digital image sensor according to various embodiments of the present disclosure.
Figure 13:
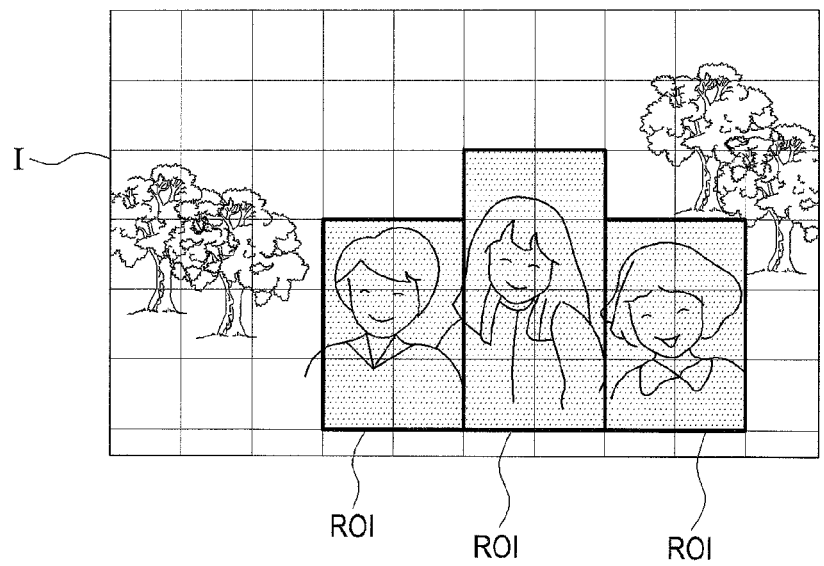

FIGS. 12 and 13 illustrate screens captured by a digital image sensor according to various embodiments of the present disclosure. For example, FIGS. 12 and 13 illustrate a structure in which arrangement of the higher-exposure pixels 115a and arrangement of the lower-exposure pixels 115b may be changed in an image sensor.

According to various factors such as a photographing point in time or a particular object to be photographed, a bright region and a dark region may vary in an image region I. An electronic device including an image sensor according to various embodiments of the present disclosure may recognize a bright region and a dark region in an image of the object and rearrange the higher-exposure pixels 115a and the lower-exposure pixels 115b. In addition according to user's intention of manipulating the electronic device, a particular region may be set as a Region of Interest (ROI).

Referring to FIGS. 12 and 13, when an electronic device including the image sensor 100 according to various embodiments of the present disclosure, for example, a photographing device, is set to a portrait mode, a region corresponding to at least a part of a human body, for example, a face or the whole body, may be set as the ROI in the image region I. When an image sensor according to various embodiments of the present disclosure, for example, the image sensor 100 sets the ROI in the image region I to be captured, the image sensor 100 may set pixels corresponding to the ROI as the higher-exposure pixels 115a or the lower-exposure pixels 115b, or may adjust a ratio of the number of higher-exposure pixels 115a to the number of lower-exposure pixels 115b. For instance, the image sensor 100 may dynamically assign an arrangement of a pixel group corresponding to the higher-exposure pixels 115a and an arrangement of a pixel group corresponding to the lower-exposure pixels 115b.

The pixels of the image sensor may be classified into a higher-exposure group and a lower-exposure group by differently setting an arrangement, an exposure duration rate, a gain rate, or the like for pixels of the first pixel group Group 1 and pixels of the second pixel group Group 2, according to a dynamic range of a bright region and a dark region of an image or according to the set ROI or a region out of the ROI for different outputs of the pixels. For example, in a dark region or an ROI in a photographing screen, a rate of the first pixel group Group 1 (for example, a group of higher-exposure pixels) whose pixel output values are set higher may be higher than that of the second pixel group Group 2; whereas, in a bright region or a region out of the ROI, a rate of Group 2 (for example, a group of lower-exposure pixels) whose pixel output values are set lower may be higher than that of Group 1. Hence, the image sensor 100 may secure a wider dynamic range for capturing an image. When acquiring information of capturing an image, the controller of the electronic device having mounted thereon the image sensor according to various embodiments of the present disclosure may detect a focusing state through information detected from lower-efficiency pixels disposed to correspond to the pixels of the first pixel group Group 1, for example, the phase-difference focus detection pixels 115c.

As mentioned above, the phase-difference focus detection pixels 115c may have lower light-receiving efficiency than the image detection pixels 115a and 115b. For example, the phase-difference focus detection pixels 115c may have a phase-separation structure in which the optical axis P of the light-receiving region 15 and the optical axis L of the micro lens are disposed to deviate from each other, or the light-shielding layer 19 is provided to shield a portion of the light-receiving region 15. The light passing through the phase-separation structure may be partially shielded or its incident path changed, such that the amount of light incident to a light-receiving region of the phase-difference focus detection pixels 115c may be smaller than that of light incident to a light-receiving region of the image detection pixels 115a and 115b.

In the image sensor according to various embodiments of the present disclosure, the phase-difference focus detection pixels 115c may be distributed uniformly over the entire region of the image sensor 100. Moreover, the ROI is set to be different according to a photographing mode or a photographing time, such that the phase-difference focus detection pixels 115c may also be distributed in a region out of the ROI. According to an embodiment, the phase-difference detection pixels 115c disposed out of the ROI may be deactivated to be excluded from a focus detection operation. For example, the focusing state is detected merely with the phase-difference focus detection pixels 115c disposed in the ROI. Even when the particular phase-difference focus detection pixels 115c are not deactivated, the controller of the electronic device may detect the focusing state at a capturing time according to the information detected from the phase-difference focus detection pixels 115c disposed in the ROI, for example, the phase-difference focus detection pixels 115c disposed to correspond to the pixels of the first pixel group Group 1.

FIG. 12 illustrates a structure in which lower-efficiency pixels (phase-difference focus detection pixels) of a region corresponding to faces of figures that are subjects include the higher-exposure pixels 115a in a region I of a capturing image. As stated above, pixels of a particular region may be set to the higher-exposure pixels 115a by using an algorithm provided in the controller of the electronic device having the image sensor mounted thereon with respect to the faces of the figures that are subjects. The algorithm may be implemented with at least one of hardware mounted on the electronic device, such as a Central Processing Unit (CPU) and Read Only Memory (ROM), firmware or software mounted on hardware, and an application installed on the electronic device.

According to an embodiment, as illustrated in FIG. 13, as desired by a user, pixels of a particular region may be set to the higher-exposure pixels 115a. If regions corresponding to faces of figures that are subjects are set to the ROIs at a capturing time, the controller of the electronic device detects a focusing state through information detected from the phase-difference detection pixels 115c disposed to correspond to the higher-exposure pixels 115a in the ROIs. For example, the phase-difference detection pixels 115c disposed out of the ROIs may be deactivated or information detected from the phase-difference detection pixels 115c disposed out of the ROIs may be excluded by the controller of the electronic device. Hence, by using the information detected from the phase-difference detection pixels 115c disposed in the group of the higher-exposure pixels 115a, the processor of the electronic device may detect the focusing state of a capturing image.

FIG. 13 illustrates a structure in which the region I of the capturing image is divided into blocks of a predetermined size and blocks of a region in which full bodies of the subject figures exist are set as ROIs. At least some of the phase-difference detection pixels 115c included in the blocks corresponding to the ROIs may be set to correspond to the higher-exposure pixels 115a, and image information regarding the focusing state may be detected from the phase-difference detection pixels 115c disposed to correspond to the higher-exposure pixels 115a in the ROIs. The controller of the electronic device detects the focusing state of the image sensor 100 from the detected image information, thus improving the performance of focus detection of the ROIs. According to various embodiments of the present disclosure, the phase-difference detection pixels 115c of blocks that do not correspond to the ROIs may also be in either the higher-exposure pixels 115a or the lower-exposure pixels 115b.

The following description will be made of the electronic device having the image sensor according to various embodiments of the present disclosure and an operation of setting or re-setting disposition of higher-exposure pixels and lower-exposure pixels in the electronic device.

Figure 14:
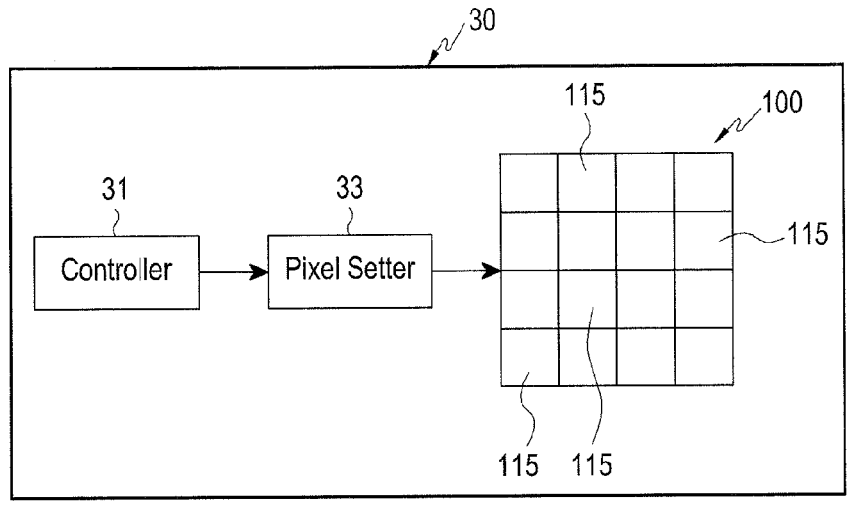
FIG. 14 is a block diagram of an electronic device including a digital image sensor according to various embodiments of the present disclosure.

FIG. 14 is a block diagram of an electronic device 30 including the digital image sensor 100 according to various embodiments of the present disclosure. The electronic device 30 may include an electronic sensor, for example, the digital image sensor 100.

The electronic sensor may comprise a first pixel, a second pixel having a lower exposure efficiency than the first pixel, a first pixel group configured to acquire an exposure amount and a second pixel group configured to acquire a less exposure amount than the exposure amount. The first pixel group includes at least one of the second pixel and the second pixel of the first pixel group detects a subject image for acquiring focusing state information.

The first pixel may comprise a white-light detection pixel and the second pixel may comprise at least one of a red-light detection pixel, a green-light detection pixel and a blue-light detection pixel.

The first pixel may comprise a pixel including a first filter and the second pixel may comprise a pixel including a second filter passing therethrough less light than is passed through the first filter during a same exposure duration.

The first pixel may comprise a pixel including a first lens and the second pixel may comprise a pixel including a second lens passing therethrough less light than is passed through the first lens during a same exposure duration.

At least the first pixel or the second pixel may comprise an interconnection region, a light-receiving region disposed between the interconnection regions, and a micro lens disposed on the light-receiving region.

The second pixel may include a phase-separation structure and the phase-separation structure may includes a light-shielding layer.

The second pixel may comprise a pixel configured to detect light passing through a side of an exit pupil of a micro lens.

The exposure amount and the less exposure amount may be determined based at least in part on an image formed on the electronic sensor.

The exposure amount and the less exposure amount may be determined based at least in part on a dynamic range ratio of a bright region to a dark region of at least in part of an image formed on the electronic sensor.

The exposure amount and the less exposure amount may be determined based at least on one of an exposure duration and photoelectric conversion efficiency.

Figure 15:
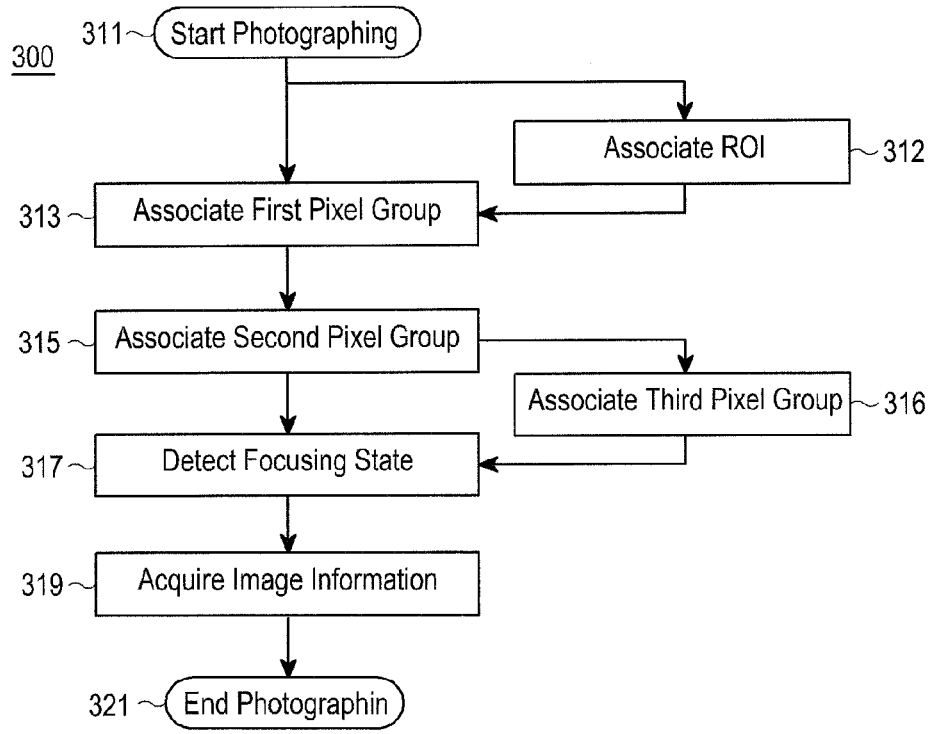
FIG. 15 is a flowchart of a method for controlling a digital image sensor according to various embodiments of the present disclosure.

FIG. 15 is a flowchart illustrating a method 300 for controlling the digital image sensor 100 according to various embodiments of the present disclosure.

The method may comprise associating at least a first pixel of an electronic sensor with a first pixel group, the first pixel group configured to detect at least a first portion of a subject image for a first exposure duration; associating at least a second pixel of the electronic sensor with a second pixel group, the second pixel group configured to detect at least a second portion of the subject image for a second exposure duration, the second exposure duration being shorter than the first exposure duration; and acquiring focusing state information via the at least a first pixel.

The associating the first pixel may comprise associating with the first pixel group a pixel having a lower exposure efficiency than the second pixel during a same exposure duration.

The associating the at least a first pixel may comprise associating with the first pixel group a pixel including a phase-separation structure and the phase-separation structure may include a light-shielding layer.

The method may further comprise configuring the first pixel group and the second pixel group in a repeated pattern.

The method may further comprise configuring the first pixel group and the second pixel group in an irregular pattern.

The method may further comprise detecting the at least a first portion of the subject image for the first exposure duration via the first pixel group; and detecting the at least a second portion of the subject image for the second exposure duration via the second pixel group.

The detecting at least a second portion may comprise detecting the at least a second portion of the subject image at least twice during detecting the at least a first portion of the subject image for the first exposure duration via the first pixel group.

The method may further comprise determining a region of interest at the subject image and the associating the first pixel may comprise associating at least a pixel corresponding to the region of interest with the first pixel group.

The associating the at least a first pixel comprises associating one or more pixels with the first pixel group, a number of the one or more pixels being greater than a number of pixels associated with the second pixel group, in at least a region of interest.

The electronic device 30 may include the image sensor 100 according to various embodiments of the present disclosure, and includes a controller 31 and a pixel setter 33 to set an exposure amount of each of the pixels 115 of the image sensor 100 differently, for example, to set each pixel 115 to one of the higher-exposure pixel 115a, the lower-exposure pixel 115b, and optionally, the middle-exposure pixel. The exposure amount of each pixel 115 may be dynamically set, for example, according to a composition of a screen at a capturing time or a position of a subject in a capturing screen.

The electronic device 30 may be, for example, a digital camera, a Portable Multimedia Player (PMP), a mobile communication terminal, a tablet Personal Computer (PC), a vehicle navigator or black box, or a laptop computer. If the image sensor 100 is used as a closed circuit camera or a video communication camera, the image sensor 100 may be provided as a separate camera module and may be connected to a main body of the electronic device 30, for example, a desktop computer or a server, in a wireless or wired manner.

The controller 31 may include hardware such as a CPU, an Application Processor (AP), a Read Only Memory (ROM), a Random Access Memory (RAM), or a firmware or software mounted on the hardware.

For the sake of conveniences, dynamically setting disposition of the pixels 115 according to various embodiments of the present disclosure will be described on the assumption that the structures of the image detection pixels 115a and 115b are the same as each other. However, it should be noted that when the respective pixels 115 of the image sensor 100 according to various embodiments of the present disclosure are configured, if the image detection pixels 115a and 115b have different physical structures like disposition of the color filters 21, the pixels 115 of the image sensor 100 may be classified into and disposed as more groups than described below.

The pixels 115 of the image sensor 100 according to various embodiments of the present disclosure may be classified into and set as 2 groups including the first pixel group Group1 including the higher-exposure pixels 115a and the second pixel group Group2 including the lower-exposure pixels 115b, or 3 or more groups further including the middle-exposure group. In addition, some of the pixels 115 of the image sensor 100 according to various embodiments of the present disclosure may include the phase-difference focus detection pixels 115c which may be distributed uniformly over the entire region of the image sensor 100. Thus, when the pixels 115 of the image sensor 100 are classified and set according to an exposure amount, the phase-difference focus detection pixels 115c may also be classified into pixel groups having different exposure amounts. In this case, image information necessary for focus detection may be provided from the phase-difference focus detection pixels 115c assigned to correspond to the higher-exposure pixels 115a.

Moreover, in the following description, when the image detection pixels 115a and 115b are classified into and set as the first pixel group Group 1 and the second pixel group Group 2, an exposure amount may be adjusted according to an exposure duration. However, as mentioned previously, an exposure of each image detection pixel may also be adjusted according to photoelectric conversion efficiency or adjustment of a lens or a filter as well as an exposure duration.

Hereinafter, the method 300 for controlling the image sensor 100 according to various embodiments of the present disclosure through the electronic device 30 will be described with reference to FIGS. 14 and 15.

Once photographing starts at operation 311, the controller 31 of the electronic device 30, for example, an AP of a mobile communication terminal including the image sensor 100, sets some of the pixels 115 of the image sensor 100 as the first pixel group Group 1 for detecting a subject image during a set exposure duration at operation 313, and sets at least some of remaining pixels 115 of the image sensor 100 as the second pixel group Group 2 for detecting a subject image during an exposure duration that is set shorter than an exposure duration of Group 1 at operation 315. For example, the pixels classified as Group 1 are set to the higher-exposure pixels 115a, and the pixels classified as Group 2 are set to the lower-exposure pixels 115b.

If there is no separate setting for the electronic device 30, the higher-exposure pixels 115a and the lower-exposure pixels 115b may be distributed adjacent to each other. If the higher-exposure pixels 115a and the lower-exposure pixels 115b are distributed in adjacent to each other, then a dark image and a bright image may be acquired from images corresponding to the pixels and combined with each other, thus acquiring one image having improved dynamic range. Alternatively, in a dark part of a capturing image region, a rate of Group 1 may be set higher than that of Group 2. If the photographing mode, for example, a portrait mode, has already been set, a face or a full body of a figure may be set as an ROI in the image region at operation 312. The ROI may be set by the photographing mode or by a user's selection.

Setting the ROI at operation 312 may precede or substantially coincide with setting the first pixel group Group 1 at operation 313. For example, if the electronic device 30 has already been set to the portrait mode, the controller 31 may first identify a position of a figure to set the ROI in the capturing image region I at operation 312, and then may control the pixel setter 33 to set the rate of Group 1 higher than that of Group 2 at operation 313. The controller 31 may set the ROI according to the capturing mode or user's selection at operation 312 and at the same time may set at least some of pixels of the ROI as Group 1 at operation 313.

The pixel setter 33 may classify the pixels 115 of the image sensor 100 into Group 1 and Group 2, for example, the higher-exposure pixels 115a and the lower-exposure pixels 115b, in response to the foregoing command of the controller 31. If the controller 31 sets classification of the pixels 115 of the image sensor 100 into two groups, the setting of the second pixel group Group 2 at operation 315 may substantially coincide with the setting of the first pixel group Group 1 at operation 313.

In a dark region or an ROI, a rate of the pixels of Group 1 having a longer exposure duration may be higher than a rate of Group 2, and in a bright region or a region out of the ROI, a rate of the pixels of Group 2 having a shorter exposure duration may be higher than a rate of Group 1. Thus, the pixels of Group 1 may detect more image information of the dark region or the ROI, and the pixels of Group 2 may detect more image information of the bright region or the region out of the ROI. For example, the electronic device 30 may identify the dark region and the bright region in the capturing image region I, and may set the rate of Group 1 higher than the rate of Group 2 in the identified corresponding region. Also, according to a user's setting of the ROI or a photographing mode of the electronic device 30, for example, the portrait mode or the landscape mode, the controller 31 of the electronic device 30, for example, the CPU or the AP, may set the ROI. Once the ROI is set, more pixels of the ROI may be set as Group 1 or Group 2.

If there are pixels that are not set as either Group 1 or Group 2 among the pixels 115 of the image sensor 100, these pixels may optionally be set as the third pixel group Group 3 for detecting a subject image during an exposure duration that is shorter than that of Group 1 and longer than that of Group 2, at operation 316. In this case, the pixels of Group 3 may operate as middle-exposure pixels and the pixels of Group 2 may operate as lower-exposure pixels. However, as mentioned above, without separately setting Group 3, the pixels of Group 2 may detect an exposed image at least twice with different exposure durations. If the pixels of Group 2 detect the exposed image at least twice, classification of the pixels of the image sensor 100 may be simplified and at the same time, a more effective WDR function may be implemented.

Some of the pixels 115 of the image sensor 100 according to various embodiments of the present disclosure may include lower-efficiency pixels, for example, the phase-difference focus detection pixels 115c, and may be disposed variously, for example, uniformly over the entire region of the image sensor 100, irregularly on the region of the image sensor 100, or centralized on the region of the image sensor 100. The phase-difference focus detection pixels 115c may also be set to belong to Group 1 or Group 2 for the WDR function, in other words, a group of the higher-exposure pixels 115a or a group of the lower-exposure pixels 115b. At operation 317 of detecting a focusing state, when compared with information detected from the phase-difference focus detection pixels 115c set as Group 2, information detected from the phase-difference focus detection pixels 115c set as Group 1 may include more accurate information regarding a focusing state. The controller 31 may detect the focusing state of the image sensor 100 from the image information acquired from the phase-difference focus detection pixels 115c corresponding to the pixels set as Group 1, at operation 317.

Once information about the focusing state is detected, the controller 31 may control focus adjustment of the lens mounted on the electronic device 30 through a separate process. Focus adjustment may be implemented variously through an operation mechanism of a general photographing device, and thus will not be described in detail.

When the focusing state is optimized, the controller 31 combines the image information detected from the pixels 115 to acquire one complete image at operation 319 and terminates photographing at operation 321.

According to various embodiments of the present disclosure, at least some of pixels having low light-receiving efficiency such as, for example, phase-difference focus-detection pixels, may secure a maximum exposure duration permitted by the image sensor, and even a maximum exposure amount. Thus, the image sensor according to various embodiments of the present disclosure may perform the WDR function and at the same time, the phase-difference focus-detection pixels may secure a sufficient exposure amount, such that the image sensor may smoothly perform focus detection. Moreover, the phase-difference focus detection pixels may operate in the same environment, for example, with the same exposure duration, thus maintaining consistency among the phase-difference focus detection pixels.

The method for controlling the electronic sensor such as, for example, the image sensor, according to various embodiments of the present disclosure can be embodied as a non-transitory computer-readable recording medium having recorded thereon computer-readable code, instructions, program, or software. The non-transitory computer-readable recording medium may be any data storage device that can store data which can be thereafter be read by a computer system. Examples of non-transitory computer-readable recording medium include, but are not limited to, ROM, RAM, optical disks, magnetic tapes, floppy disks, hard disks, and non-volatile memories. The non-transitory computer-readable recording medium can also be distributed over network-coupled computer systems so that the computer-readable code, instructions, program, or software is stored and executed in a decentralized fashion.

While the present disclosure has been particularly shown and described with reference to example embodiments, it will be understood by those of ordinary skill in the art that various changes in form and details may be made without departing from the spirit and scope of the present disclosure as defined by the following claims. For example, in the description of the various embodiments of the present disclosure, it has been described that the pixels of the ROI in the capturing image region I are disposed as higher-exposure pixels, but such a description is merely intended for brevity of the description. For example, in the image sensor according to the various embodiments of the present disclosure, at least some of the pixels of the image sensor may be disposed as higher-exposure pixels and at least some of the others may be disposed as lower-exposure pixels, in the ROI. When the higher-exposure pixels and the lower-exposure pixels are disposed in the ROI, a rate of the higher-exposure pixels may be higher than that of the lower-exposure pixels. In addition, from the lower-efficiency pixels disposed to correspond to the higher-exposure pixels in the ROI, for example, the phase-difference focus detection pixels 115c, information necessary for focus detection may be acquired.

The image sensor and the method for controlling the same according to various embodiments of the present disclosure provide a way to secure an exposure amount of lower-efficiency pixels having a small amount of light reception, for example, phase-difference focus detection pixels, thereby implementing focus detection and WDR with a single image sensor. Furthermore, while normally performing functions of pixels having longer exposure duration due to a smaller amount of light reception than other pixels, the WDR function may also be implemented. Hence, the image sensor and the method for controlling the same according to various embodiments of the present disclosure may contribute to improvement of quality of a captured image and miniaturization of a camera module and an electronic device.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic sensor comprising:
a processor;
a plurality of first pixels; and
a plurality of second pixels having a lower light receiving efficiency than the light receiving efficiency of the plurality of the first pixels,
wherein, while photographing, the processor is configured to set a portion of the plurality of the first pixels and a portion of the plurality of the second pixels as a first pixel group, and at least another portion of the plurality of the first pixels and at least another portion of the plurality of the second pixels as a second pixel group,
wherein the first pixel group is configured to acquire a first exposure amount and the second pixel group is configured to acquire a second exposure amount, the second exposure amount being lower than the first exposure amount,
wherein the processor is configured to detect a subject image for acquiring focusing state information through each second pixel of the portion of the plurality of the second pixels of the first pixel group, and
wherein each second pixel of the portion of the plurality of the second pixels of the first pixel group through which focusing state information is acquired has:
the lower light receiving efficiency than all first pixels of the first and second pixel groups, and
the first exposure amount higher than the second exposure amount of all first and second pixels of the second pixel group.

2. The electronic sensor of claim 1, wherein each of the plurality of the first pixels comprises a white-light detection pixel, and
wherein each of the plurality of the second pixels comprises at least one of a red-light detection pixel, a green-light detection pixel, or a blue-light detection pixel.

3. The electronic sensor of claim 1, wherein each of the plurality of the first pixels comprises a pixel including a first filter, and
wherein each of the plurality of the second pixels comprises a pixel including a second filter passing therethrough less light than is passed through the first filter during a same exposure duration.

4. The electronic sensor of claim 1, wherein each of the plurality of the first pixels comprises a pixel including a first lens, and
wherein each of the plurality of the second pixels comprises a pixel including a second lens passing therethrough less light than is passed through the first lens during a same exposure duration.

5. The electronic sensor of claim 1, wherein at least one of each of the plurality of the first pixels or each of the plurality of the second pixels comprises an interconnection region, a light-receiving region disposed between the interconnection regions, and a micro lens disposed on the light-receiving region.

6. The electronic sensor of claim 1, wherein each of the plurality of the second pixels comprises a phase-separation structure, the phase-separation structure including a light-shielding layer.

7. The electronic sensor of claim 1, wherein each of the plurality of the second pixels comprises a pixel configured to detect light passing through a side of an exit pupil of a micro lens.

8. The electronic sensor of claim 1, wherein the first exposure amount and the second exposure amount are determined based at least in part on an image formed on the electronic sensor.

9. The electronic sensor of claim 1, wherein the first exposure amount and the second exposure amount are determined based at least in part on a dynamic range ratio of a bright region to a dark region of at least a part of an image formed on the electronic sensor.

10. The electronic sensor of claim 1, wherein the first exposure amount and the second exposure amount are determined based at least on one of an exposure duration or photoelectric conversion efficiency.

11. A photographing method for controlling an imaging device comprising:
associating a portion of a plurality of first pixels of an electronic sensor and a portion of a plurality of second pixels of the electronic sensor with a first pixel group;
associating at least another portion of the plurality of the first pixels of the electronic sensor and at least another portion of the plurality of the second pixels of the electronic sensor with a second pixel group; and acquiring focusing state information by detecting a subject image by each second pixel of the portion of the plurality of the second pixels of the first pixel group, wherein the first pixel group is configured to acquire a first exposure amount and the second pixel group is configured to acquire a second exposure amount, the first exposure amount being different than the second exposure amount, wherein the plurality of first pixels have a light receiving efficiency different than the light receiving efficiency of the plurality of the second pixels, and wherein each second pixel of the portion of the plurality of the second pixels of the first pixel group through which focusing state information is acquired has:
- a lower light receiving efficiency than the light receiving efficiency of all first pixels of the first and second pixel groups, and
- an exposure amount higher than the second exposure amount of all first and second pixels of the second pixel group.

12. The photographing method of claim 11, wherein each of the plurality of the first pixels comprises a white-light detection pixel, and
wherein each of the plurality of the second pixels comprises at least one of a red-light detection pixel, a green-light detection pixel, or a blue-light detection pixel.

13. The photographing method of claim 11, wherein each of the plurality of the first pixels comprises a pixel including a first filter, and
wherein each of the plurality of the second pixels comprises a pixel including a second filter passing therethrough less light than is passed through the first filter during a same exposure duration.

14. The photographing method of claim 11, wherein each of the plurality of the first pixels comprises a pixel including a first lens, and
wherein each of the plurality of the second pixels comprises a pixel including a second lens passing therethrough less light than is passed through the first lens during a same exposure duration.

15. The photographing method of claim 11, wherein at least one of each of the plurality of the first pixels or each of the plurality of the second pixels comprises an interconnection region, a light-receiving region disposed between the interconnection regions, and a micro lens disposed on the light-receiving region.

16. The photographing method of claim 11, wherein each of the plurality of the second pixels comprises a phase-separation structure, the phase-separation structure including a light-shielding layer.

17. The photographing method of claim 11, wherein each of the plurality of the second pixels comprises a pixel configured to detect light passing through a side of an exit pupil of a micro lens.

18. The photographing method of claim 11, wherein the first exposure amount and the second exposure amount are determined based at least in part on an image formed on the electronic sensor.

19. The photographing method of claim 11, wherein the first exposure amount and the second exposure amount are determined based at least in part on a dynamic range ratio of a bright region to a dark region of at least a part of an image formed on the electronic sensor.

20. A non-transitory machine-readable storage medium storing instructions that, when executed by a processor causes the processor to perform operations comprising:

associating a portion of a plurality of first pixels of an electronic sensor and a portion of a plurality of second pixels of the electronic sensor with a first pixel group;

associating at least another portion pixel of the plurality of the first pixels of the electronic sensor and at least another portion of the plurality of the second pixels of the electronic sensor with a second pixel group; and acquiring focusing state information by detecting a subject image by each second pixel of the portion of the plurality of the second pixels of the first pixel group wherein the first pixel group is configured to acquire a first exposure amount and the second pixel group is configured to acquire a second exposure amount, the first exposure amount being different than the second exposure amount, wherein the plurality of first pixels have a light receiving efficiency different than the light receiving efficiency of the plurality of the second pixels, and wherein each second pixel of the portion of the plurality of the second pixels of the first pixel group through which focusing state information is acquired has:
- a lower light receiving efficiency than the light receiving efficiency of all first pixels of the first and second pixel groups, and
- an exposure amount higher than the second exposure amount of all first and second pixels of the second pixel group.

21. The photographing method of claim 11, wherein the first exposure amount and the second exposure amount are determined based at least on one of an exposure duration or photoelectric conversion efficiency.

* * * * *